(12) United States Patent
Sugo et al.

(10) Patent No.: US 9,263,333 B2
(45) Date of Patent: Feb. 16, 2016

(54) WAFER PROCESSING LAMINATE, WAFER PROCESSING MEMBER, TEMPORARY ADHERING MATERIAL FOR PROCESSING WAFER, AND MANUFACTURING METHOD OF THIN WAFER

(71) Applicant: SHIN-ETSU CHEMICAL CO., LTD., Tokyo (JP)

(72) Inventors: Michihiro Sugo, Takasaki (JP); Hideto Kato, Takasaki (JP); Shohei Tagami, Annaka (JP); Hiroyuki Yasuda, Tomioka (JP); Masahito Tanabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 102 days.

(21) Appl. No.: 14/060,234

(22) Filed: Oct. 22, 2013

(65) Prior Publication Data
US 2014/0154868 A1    Jun. 5, 2014

(30) Foreign Application Priority Data
Nov. 30, 2012 (JP) ................. 2012-262542

(51) Int. Cl.
| | |
|---|---|
| H01L 21/30 | (2006.01) |
| H01L 21/78 | (2006.01) |
| H01L 21/18 | (2006.01) |
| H01L 21/683 | (2006.01) |

(52) U.S. Cl.
CPC .............. *H01L 21/78* (2013.01); *H01L 21/187* (2013.01); *H01L 21/6835* (2013.01); *H01L 21/6836* (2013.01); *H01L 2221/6834* (2013.01); *H01L 2221/68327* (2013.01); *H01L 2221/68381* (2013.01); *H01L 2221/68386* (2013.01); *Y10T 428/1457* (2015.01)

(58) Field of Classification Search
CPC ............. H01L 2221/6834; H01L 2221/68381; H01L 2221/68386; H01L 29/7784
USPC .................................. 438/459, 977; 257/619
See application file for complete search history.

(56) References Cited

U.S. PATENT DOCUMENTS

| | | | |
|---|---|---|---|
| 7,541,264 B2 | 6/2009 | Gardner et al. | |
| 8,999,817 B2 * | 4/2015 | Tagami .................... | C09J 7/00 438/464 |
| 2005/0233547 A1 * | 10/2005 | Noda et al. ................ | 438/459 |

(Continued)

FOREIGN PATENT DOCUMENTS

| | | |
|---|---|---|
| JP | A-2004-064040 | 2/2004 |
| JP | A-2006-328104 | 12/2006 |

*Primary Examiner* — Long K Tran
(74) *Attorney, Agent, or Firm* — Oliff PLC

(57) ABSTRACT

A wafer processing laminate, a wafer processing member, a temporary adhering material for processing a wafer, and a method for manufacturing a thin wafer, which facilitates to establish a temporary adhering the wafer and the support, enables to form a layer of uniform thickness on a heavily stepped substrate, and is compatible with the TSV formation and wafer back surface interconnect forming steps, and the wafer processing laminate includes a support, a temporary adhesive material layer formed thereon and a wafer laminated on the temporary adhesive material layer, where the wafer has a circuit-forming front surface and a back surface to be processed, wherein the temporary adhesive material layer includes a three-layered structure composite temporary adhesive material layer.

21 Claims, 1 Drawing Sheet

(56) References Cited

U.S. PATENT DOCUMENTS

2012/0175045 A1* 7/2012 Furuya et al. ................. 156/154
2013/0220687 A1* 8/2013 Tagami ...................... C09J 7/00
  174/259

* cited by examiner

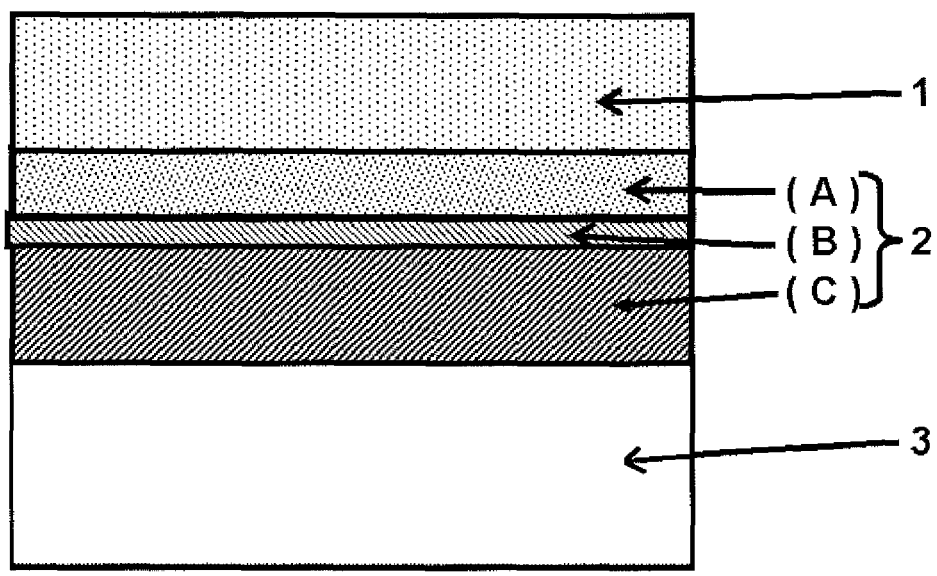

WAFER PROCESSING LAMINATE, WAFER PROCESSING MEMBER, TEMPORARY ADHERING MATERIAL FOR PROCESSING WAFER, AND MANUFACTURING METHOD OF THIN WAFER

TECHNICAL FIELD

The present invention relates to a wafer processing laminate a wafer processing member, a temporary adhering material for processing a wafer, and a method for manufacturing a thin wafer, which can realize to obtain a thin wafer effectively.

BACKGROUND ART

Three-dimensional semiconductor packages become essential for a higher density and larger capacity. The three-dimensional packaging technology is by thinning semiconductor chips, and laminating them in multilayer structure while providing through silicon via (TSV) interconnects. For realizing the above, it is required to conduct the steps of thinning a substrate having a semiconductor circuit formed thereon by grinding its non-circuit-forming surface (it is also called as "back surface"), and further forming electrodes including TSV on the back surface. In the prior art, prior to the step of grinding the back surface of a silicon substrate, a protective tape is adhered to the back surface of the substrate opposite to the surface to be ground for preventing the wafer from breakage during the grinding step. However, this tape uses an organic resin film as a base material, it is flexible, but is insufficient in strength and heat resistance to withstand the TSV forming step and the step of forming interconnects on the back surface so that it is not suitable.

It is then proposed to bond a semiconductor substrate to a support such as silicon and glass via an adhesive layer whereby it becomes a system to sufficiently withstand the steps of grinding a back surface, and forming TSV or electrodes on the back surface. The adhesive layer is important for this system to bond the substrate to the support. The adhesive layer is required to bond the substrate to the support without leaving gaps, to have sufficient durability which can withstand the subsequent steps, and eventually allow the thin wafer to be easily delaminating from the support. The adhesive layer is thus finally removed so that, in the present specification, the adhesive layer is referred to as a temporary adhesive layer (or a temporary adhesive material layer).

With regard to the conventionally known temporary adhesive layers and a removing method thereof, there have been proposed a technique in which high intensity light is irradiated to an adhesive material containing a light absorbing substance to decompose the adhesive material layer whereby the adhesive material layer is peeled from the support (Patent Literature 1), and a technique in which a heat fusible hydrocarbon type compound is used as an adhesive material, and bonding and delaminating are carried out in a heat-molten state (Patent Literature 2). The former technique involved the problems that it requires an expensive tool such as laser, and a treatment time per one substrate is longer. The latter technique is simple because of control only by heat, but the applicable range is limited since thermal stability at high temperatures exceeding 200° C. is insufficient. Further, these temporary adhesive layers are not adequate to form a layer with uniform thickness on a heavily stepped substrate and to provide a complete adhesion to the support.

It has also been proposed to use a silicone adhesive agent as the temporary adhesive material layer (Patent Literature 3). This is to bond a substrate to a support using an addition curable type silicone adhesive agent, and on removal, the assembly is immersed in a chemical solution capable of dissolving or decomposing the silicone resin, whereby the substrate is separated from the support. Thus, this method takes a very long time for removal and is difficulty applicable to the actual manufacturing process.

CITATION LIST

Patent Literature

PATENT LITERATURE 1: JP 2004-64040A
PATENT LITERATURE 2: JP 2006-328104A
PATENT LITERATURE 3: U.S. Pat. No. 7,541,264B

SUMMARY OF THE INVENTION

Technical Problem

The present invention has been accomplished in view of the above-mentioned circumstance, and an object thereof is to provide a wafer processing laminate, a wafer processing member, a temporary adhering material for processing a wafer, and a method for manufacturing a thin wafer using the same, which facilitates to establish a temporary adhering, enables to form a layer of uniform thickness on a heavily stepped substrate, is compatible with the TSV formation and wafer back surface interconnect forming steps, allows for easy removal, and can heighten productivity of the thin wafer.

Solution to Problem

The present invention has been done to solve the above-mentioned problems and to provide a wafer processing laminate comprising a support, a temporary adhesive material layer formed thereon and a wafer laminated on the temporary adhesive material layer, where the wafer has a circuit-forming front surface and a back surface to be processed, wherein the temporary adhesive material layer comprises a three-layered structure composite temporary adhesive material layer comprising a first temporary adhesive layer of a non-silicone thermoplastic resin layer (A) releasably adhered on a surface of the wafer, a second temporary adhesive layer of a thermoplastic siloxane resin polymer layer (B) laminated on the first temporary adhesive layer, and a third temporary adhesive layer of a thermosetting siloxane-modified polymer layer (C) laminated on the second temporary adhesive layer and releasably adhered to the support.

Also, in the present invention, it is provided a wafer processing member comprising a support and a temporary adhesive material layer formed thereon, on the temporary adhesive material layer of which a wafer is to be temporary adhered, where the wafer has a circuit-forming front surface and a back surface to be processed, wherein the temporary adhesive material layer comprises a three-layered structure composite temporary adhesive material layer comprising a first temporary adhesive layer of a non-silicone thermoplastic resin layer (A) releasably adherable on a surface of the wafer, a second temporary adhesive layer of a thermoplastic siloxane resin polymer layer (B) laminated on the first temporary adhesive layer, and a third temporary adhesive layer of a thermosetting siloxane-modified polymer layer (C) laminated on the second temporary adhesive layer and releasably adhered to the support.

Moreover, in the present invention, it is provided a temporary adhering material for processing a wafer which is a material for temporary adhering the wafer to a support, where the wafer has a circuit-forming front surface and a back surface to be processed, wherein the temporary adhering material for processing wafer comprises a three-layered structure composite temporary adhesive material layer comprising a first temporary adhesive layer of a non-silicone thermoplastic resin layer (A) releasably adherable to the front surface of the wafer, a second temporary adhesive layer of a thermoplastic siloxane polymer layer (B) laminated on the first temporary adhesive layer, and a third temporary adhesive layer of a thermosetting siloxane-modified polymer layer (C) laminated on the second temporary adhesive layer and releasably adherable to the support.

According to such a wafer processing laminate, a wafer processing member, and a temporary adhering material for processing a wafer are used, it can facilitate to establish a temporary adhering the wafer and the support, enable to form a layer of uniform thickness on a heavily stepped substrate, be compatible with the TSV formation and wafer back surface interconnect forming steps, allow for easy removal, and heighten productivity of the thin wafer.

Also, in these cases, the above-mentioned thermoplastic siloxane resin polymer layer (B) is preferably a material in which an organopolysiloxane resin containing an $R^{21}R^{22}R^{23}SiO_{1/2}$ unit ($R^{21}$, $R^{22}$ and $R^{23}$ each represent an unsubstituted or substituted monovalent hydrocarbon group having 1 to 10 carbon atoms or a hydroxyl group.) and a $SiO_{4/2}$ unit, with a molar ratio of the above-mentioned $R^{21}R^{22}R^{23}SiO_{1/2}$ unit/$SiO_{4/2}$ unit of 0.6 to 1.7, and an organopolysiloxane represented by the following formula (1) are partially subjected to dehydration condensation, a ratio of the organopolysiloxane and the organopolysiloxane resin to be subjected to dehydration condensation of 99:1 to 50:50, and a weight average molecular weight of 200,000 to 1,500,000,

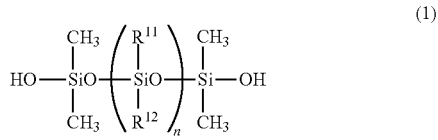

(1)

wherein $R^{11}$ and $R^{12}$ are each unsubstituted or substituted monovalent hydrocarbon group having 1 to 10 carbon atoms, and "n" represents 5,000 to 10,000.

Such a thermoplastic siloxane resin polymer layer (B) is preferred since it is excellent in adhesive property and heat resistance.

Further, in these cases, the above-mentioned thermoplastic siloxane resin polymer layer (B) preferably has a 180° peeling force of a test piece having a width of 25 mm of 2 gf or more.

The thermoplastic siloxane resin polymer layer (B) having such a peeling force is preferred since there is no fear of causing slippage of the wafer at the time of grinding the wafer.

Further, in these cases, the above-mentioned thermosetting siloxane-modified polymer layer (C) is preferably a cured product layer of a composition containing 100 parts by mass of a siloxane bond-containing polymer having a recurring unit represented by the following formula (2) and a weight average molecular weight of 3,000 to 500,000, and, as a cross-linking agent, 0.1 to 50 parts by mass of one or more selected from an amino condensed product modified by formalin or formalin-alcohol, a melamine resin, a urea resin, a phenol compound having two or more phenol groups, methylol groups or alkoxymethylol groups in the molecule in an average, and an epoxy compound having two or more epoxy groups in the molecule in an average,

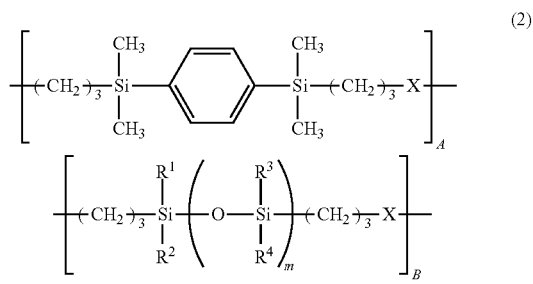

(2)

wherein $R^1$ to $R^4$ each represent a monovalent hydrocarbon group having 1 to 8 carbon atoms which may be the same or different from each other; "m" represents an integer of 1 to 100; B represents a positive number; A represents 0 or a positive number; and X represents a divalent organic group represented by the following formula (3),

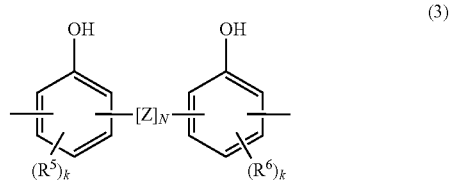

(3)

where Z represents a divalent organic group selected from either of

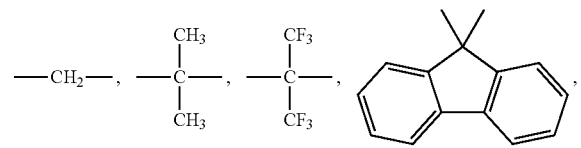

N represents 0 or 1; $R^5$ and $R^6$ each represent an alkyl group or an alkoxy group each having 1 to 4 carbon atoms and each may be the same or different from each other; and "k" represents either of 0, 1 and 2.

Further, in these cases, the above-mentioned thermosetting siloxane-modified polymer layer (C) is preferably a cured product layer of a composition containing 100 parts by mass of a siloxane bond-containing polymer having a recurring unit represented by the following formula (4) and a weight average molecular weight of 3,000 to 500,000, and, as a cross-linking agent, 0.1 to 50 parts by mass of one or more selected from a phenol compound having two or more phenol groups in the molecule in an average, and an epoxy compound having two or more epoxy groups in the molecule in an average,

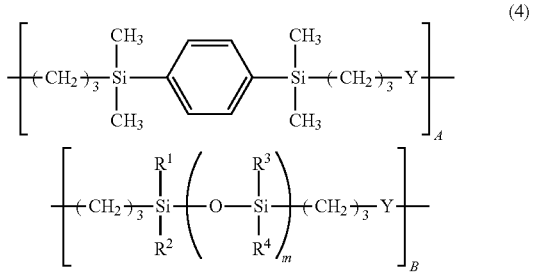
(4)

wherein $R^1$ to $R^4$ each represent a monovalent hydrocarbon group having 1 to 8 carbon atoms which may be the same or different from each other; "m" represents an integer of 1 to 100; B represents a positive number; A represents 0 or a positive number; and Y represents a divalent organic group represented by the following formula (5),

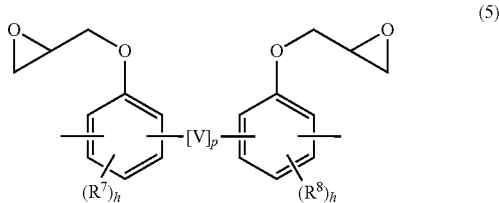
(5)

where V represents a divalent organic group selected from either of

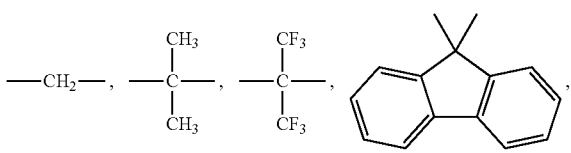

"p" represents 0 or 1; $R^7$ and $R^8$ each represent an alkyl group or alkoxy group each having 1 to 4 carbon atoms and each may be the same or different from each other; and "h" represents either of 0, 1 and 2.

Moreover, the wafer processing laminate of the present invention preferably comprises a film thickness of the second temporary adhesive layer comprising the above-mentioned thermoplastic siloxane resin polymer layer (B) of 0.1 μm to 10 μm, and a film thickness of the third temporary adhesive layer comprising the above-mentioned thermosetting siloxane-modified polymer layer (C) of 15 μm to 150 μm.

If the film thickness of the thermoplastic siloxane resin polymer layer (B) is 0.1 μm or more, when it is coated on the thermosetting modified-siloxane polymer layer (C), it can be coated on the whole surfaces without causing a portion which could not be coated, while if the film thickness of the polymer layer (B) is 10 μm or less, it can withstand to the grinding step for forming the thin wafer whereby it is preferred. Also, if the film thickness of the thermosetting siloxane-modified polymer layer (C) is 15 μm or more, it can sufficiently withstand to the grinding step for thinning the wafer, and if the film thickness of the polymer layer (C) is 150 μm or less, there is no fear of generating resin deformation in the heat treatment step such as TSV formation step, etc., and it can endure for practical use whereby it is preferred.

Furthermore, in the wafer processing laminate of the present invention, the non-silicone thermoplastic resin (A) of the first temporary adhesive layer is preferably a non-silicone thermoplastic elastomer.

When the laminate takes such a constitution, after manufacturing the thin wafer, the wafer can be more easily delaminated from the support at room temperature, so that the thin wafer which is fragile can be more easily handled.

Also, one or more of the thermoplastic siloxane resin polymer layer (B) and the thermosetting siloxane-modified polymer layer (C) preferably further comprises an antioxidant or a filler.

It is possible to improve the heat resistance and the mechanical strength of the temporary adhesive material layer by adding an antioxidant or a filler to one or more of the thermoplastic siloxane resin polymer layer (B) and the thermosetting siloxane-modified polymer layer (C).

Moreover, the present invention provides a method for manufacturing a thin wafer, which comprises the steps of (a) a step, wherein for bonding a circuit-forming front surface of the wafer having the circuit-forming front surface and a non-circuit-forming back surface to a support through a temporary adhesive material layer used for the wafer processing laminate, the layer comprising a non-silicone thermoplastic resin layer (A), a thermoplastic siloxane resin polymer layer (B) and a thermosetting siloxane-modified polymer layer (C), after forming the thermoplastic siloxane polymer layer (B) by a spin coating method on the thermosetting siloxane-modified polymer layer (C) which has been formed on the support, to bond the support on which the polymer layers (C) and (B) have been formed, and the wafer to which a circuit has been attached and the resin layer (A) has been formed under vacuum, (b) a step of heat curing the polymer layer (C), (c) a step of grinding or polishing the non-circuit-forming surface of the wafer bonded to the support, (d) a step of processing the non-circuit-forming surface of the wafer, and (e) a step of delaminating the processed wafer from the support.

According to such a method for manufacturing a thin wafer, by using the temporary adhesive material layer comprising three layers of the present invention for bonding of the wafer and the support, a thin wafer having a through electrode structure or a bump interconnect structure can be easily manufactured by using the temporary adhesive material layer.

In this case, the above-mentioned (e) step of delaminating the processed wafer from the support preferably contains (f) a step of adhering a dicing tape to the wafer surface of the processed wafer, (g) a step of subjecting a dicing tape surface to vacuum chucking to a chuck surface, and (h) a step of delaminating the support from the processed wafer by peeling-off at a temperature of the chuck surface in a temperature range of 10° C. to 100° C.

According to the above delaminating step, the support can be easily delaminated from the processed wafer, and the subsequent dicing step can be carried out easily.

In this case, it is preferred to carry out (i) a step of removing the temporary adhesive material layer remained at the circuit-forming surface of the delaminated wafer, after (e) the step of delaminating the processed wafer from the support.

There is a case where a part of the non-silicone thermoplastic resin layer (A) remains at the circuit-forming surface of the delaminated wafer from the support after Step (e).

Removal of the non-silicone thermoplastic resin layer (A) can be carried out by any of the cleaning solution which can dissolve the non-silicone thermoplastic resin layer (A), and there may be specifically mentioned pentane, hexane, cyclohexane, decane, isononane, p-menthane, pinene, isododecane, limonene, etc.

Advantageous Effects of Invention

The temporary adhesive material layer of the present invention has a three-layered structure, and in particular, by using a thermosetting siloxane-modified resin as a supporting layer for bonding the substrate, thermal decomposition of the resin does not occur as a matter of course, and flow of the resin at high temperatures does not occur, so that it can be applied to a wide range of the semiconductor film forming process because of high heat resistance. An adhesive material layer having high uniformity in thickness can be formed even on a stepped wafer. By virtue of uniformity in thickness of the film, a uniform thin wafer having 50 μm or less can be easily manufactured. Moreover, after the thin wafer is manufactured, the wafer can be easily delaminated from the support at room temperature so that a thin wafer which is fragile can be easily manufactured.

BRIEF DESCRIPTION OF DRAWINGS

FIG. 1 is a cross-sectional view of a wafer processing laminate showing one of embodiments of the invention.

DESCRIPTION OF EMBODIMENTS

The present inventors have intensively studied to accomplish the above-mentioned objects, and as a result, they have found a method for manufacturing a thin wafer having a through electrode structure or a bump interconnect structure can be formed easily by using a temporary adhesive material layer which comprises three-layer system of a thermoplastic temporary adhesive layer comprising
a non-silicone thermoplastic resin layer of (A),
a thermoplastic temporary adhesive layer comprising a thermoplastic siloxane resin polymer layer of (B), and further
a thermosetting temporary adhesive layer comprising a layer which contains a modified siloxane polymer as a main component of (C)
in the order of (A), (B) and (C) from the wafer side for bonding of the wafer and the support.

As shown in FIG. 1, the wafer processing laminate 10 of the present invention has a wafer 1 having a circuit-forming front surface and a back surface to be processed, a support 3 supporting the wafer 1 at the time of processing the wafer 1, and a temporary adhesive material layer 2 intervening between the wafer 1 and the support 3, the temporary adhesive material layer 2 comprises a three-layered structure of a non-silicone thermoplastic resin layer (A) (the first temporary adhesive layer), a thermoplastic siloxane resin polymer layer (B) (a second temporary adhesive layer), and a thermosetting siloxane-modified polymer layer (C) (the third temporary adhesive layer), the first temporary adhesive layer is releasably adhered to the surface of the wafer 1, and the third temporary adhesive layer is releasably adhered to the support 3.

Also, the wafer processing member of the present invention comprises the above-mentioned support 3, a thermosetting siloxane-modified polymer layer (C) laminated thereon, a thermoplastic siloxane resin polymer layer (B) laminated thereon, and a non-silicone thermoplastic resin layer (A) laminated thereon, and the temporary adhesive material for processing wafer of the present invention comprises a laminated material of the above-mentioned (A), (B) and (C).

In the following, the present invention is explained in more detail.
<Temporary Adhesive Material Layer>
—First Temporary Adhesive Layer (A)/Non-Silicone Thermoplastic Resin Layer—

The first temporary adhesive layer (A) is constituted by a thermoplastic resin containing no organopolysiloxane. When a polymer having a siloxane bond is used for the first temporary adhesive layer (A), there is a fear of causing intermixing with the thermoplastic siloxane resin polymer layer (B). From applicability to the stepped silicon wafer, etc., a thermoplastic resin having a good spin coating property is suitably used as a material for forming the first temporary adhesive layer (A), and there may be mentioned an olefin type thermoplastic elastomer, a polybutadiene type thermoplastic elastomer, a styrene type thermoplastic elastomer, a styrene-butadiene type thermoplastic elastomer, a styrene-polyolefin type thermoplastic elastomer, etc., in particular, a hydrogen added polystyrene type elastomer excellent in heat resistance is suitable. More specifically, there may be mentioned Tuftec (Asahi Kasei Chemicals Corporation), ESPOLEX SB type (Sumitomo Chemical Co., Ltd.), RABALON (Mitsubishi Chemical Corporation), SEPTON (Kuraray Co., Ltd.), DYNARON (JSR), etc. In addition, there may be mentioned a cycloolefin polymer represented by ZEONEX (ZEON Corporation) and a cyclic olefin copolymer represented by TOPAS (Nippon Polyplastics Co., Ltd.).

The non-silicone thermoplastic resin layer is formed by dissolving the resin in a solvent, and coating the solution on a semiconductor substrate such as a silicon wafer, etc., by means of spin coating or spray coating, etc. The solvent may be mentioned a hydrocarbon type solvent, preferably nonane, p-menthane, pinene, isooctane, etc., and nonane, p-menthane and isooctane are more preferred due to their coating property. At this time, a thickness of the film to be formed is not limited, the resin film is desirably formed depending on the steps on the substrate, suitably a film with a thickness of 0.5 micron to 50 microns, preferably between 1 μm and 30 μm is formed. In addition, to the thermoplastic resin may be added an antioxidant for the purpose of improving heat resistance, or a surfactant for the purpose of improving coating property. Specific examples of the antioxidant may be mentioned di-t-butylphenol, etc., and suitably used. Examples of the surfactant may be mentioned a fluorine-containing silicone type surfactant X-70-1102 (available from Shin-Etsu Chemical Co., Ltd.), etc., and suitably used.
—Second Temporary Adhesive Layer (B)/Thermoplastic Organopolysiloxane Resin Polymer Layer—

The thermoplastic organopolysiloxane resin polymer layer (B) which is a constitutional element of the wafer processing laminate of the present invention is not particularly limited so long as it is a thermoplastic organopolysiloxane resin polymer layer, and preferred is a material in which an organopolysiloxane resin having an $R^{21}R^{22}R^{23}SiO_{1/2}$ unit ($R^{21}$, $R^{22}$ and $R^{23}$ each represent an unsubstituted or substituted monovalent hydrocarbon group having 1 to 10 carbon atoms or a hydroxyl group.) and an $SiO_{4/2}$ unit, and a molar ratio of the $R^{21}R^{22}R^{23}SiO_{1/2}$ unit/$SiO_{4/2}$ unit being 0.6 to 1.7, and an organopolysiloxane represented by the following formula (1) are partially subjected to dehydration condensation, a ratio of the organopolysiloxane and the organopolysiloxane resin to be subjected to dehydration condensation being 99:1 to 50:50, and a weight average molecular weight thereof being 200,000 to 1,500,000,

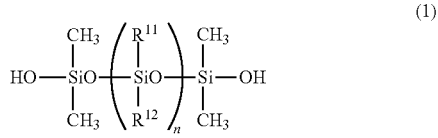

wherein $R^{11}$ and $R^{12}$ are each unsubstituted or substituted monovalent hydrocarbon group having 1 to 10 carbon atoms, and "n" represents 5,000 to 10,000.

In the above-mentioned formula (1), the organic substituents $R^{11}$ and $R^{12}$ each is an unsubstituted or substituted monovalent hydrocarbon group having 1 to 10 carbon atoms, more specifically, there may be mentioned a hydrocarbon group including an alkyl group such as a methyl group, an ethyl group, an n-propyl group, an isopropyl group, an n-butyl group, a t-butyl group, an n-pentyl group, a cyclopentyl group, an n-hexyl group, etc., a cycloalkyl group such as a cyclohexyl group, etc., an aryl group such as a phenyl group, a tolyl group, etc., a group in which a part or whole of the hydrogen atom(s) of the above groups is/are substituted by a halogen atom(s), preferably a methyl group and a phenyl group.

A molecular weight of the thermoplastic organopolysiloxane resin polymer layer is a value of a weight average molecular weight (in the present specification, "a weight average molecular weight" means this value.) obtained in accordance with a calibration curve prepared by using polystyrene standard substances by GPC (gel permeation chromatography), and the weight average molecular weight is preferably 200,000 or more, more preferably 350,000 or more, and preferably 1,500,000 or less, more preferably 1,000,000 or less. Further, a content of a low molecular weight component having a molecular weight of 740 or less is 0.5% by mass or less, more preferably 0.1% by mass or less.

If the weight average molecular weight of the thermoplastic organopolysiloxane resin polymer layer is 200,000 or more, it can withstand to the grinding step for thinning the wafer, and if the weight average molecular weight is 1,500,000 or less, it can be cleaned at the cleaning step after completion of the steps. Also, if the content of the low molecular weight component having a molecular weight of 740 or less is 0.5% by mass or less, it is preferred since sufficient heat resistance can be obtained to withstand the heat treatment during formation of a through electrode or the heat treatment of bump electrodes formed on the back surface of the wafer.

The thermoplastic organopolysiloxane resin polymer layer (B) is formed on the uncured thermosetting siloxane-modified polymer layer (C) formed on the support by coating the solution using the method such as spin coating, roll coater, etc., and used. When the thermoplastic organopolysiloxane resin polymer layer (B) is formed on the thermosetting siloxane-modified polymer layer (C) which is formed on the support by the method such as spin coating, etc., it is preferred to coat the resin as a solution. At this time, a hydrocarbon type solvent such as pentane, hexane, cyclohexane, isooctane, nonane, decane, p-menthane, pinene, isododecane, limonene, etc., is preferably used. Also, to the thermoplastic organopolysiloxane polymer solution, a conventionally known anti-oxidant can be added for improving heat resistance.

Also, the thermoplastic organopolysiloxane resin polymer layer (B) is preferably formed with a film thickness between 0.1 and 10 μm, and used. If the film thickness is 0.1 μm or more, when it is coated on the thermosetting modified siloxane polymer layer (C), it can be coated on the whole surfaces without causing a portion which could not be coated, while if the film thickness is 10 μm or less, it can withstand to the grinding step for forming the thin wafer whereby it is preferred. Incidentally, to the thermoplastic siloxane may be added a filler such as silica, etc., in an amount of 50 parts by mass or less based on 100 parts by mass of thermoplastic organopolysiloxane resin polymer (B) to further heighten heat resistance.

Also, the thermoplastic organopolysiloxane resin polymer layer (B) has a 180° peeling force of a polyimide test piece with a 25 mm width of generally 2 gf or more, preferably 3 gf or more and 30 gf or less, further preferably 5 gf or more and 20 gf or less. If it is 2 gf or more, there is no fear of causing slippage of the wafer at the time of grinding the wafer, while if it is 30 gf or less, peeling of the wafer becomes easy whereby it is preferred.

—Third Temporary Adhesive Layer(C)/Thermosetting Modified Siloxane Polymer Layer—

The thermosetting modified siloxane polymer layer (C) which is the constitutional element of the wafer processing laminate of the present invention is not particularly limited so long as it is the thermosetting modified siloxane polymer layer, and a layer of the cured product of the thermosetting composition comprising the thermosetting modified siloxane polymer represented by either of the following formula (2) or (4) as a main component is preferred.

Polymer of the Formula (2):

A phenol group-containing organosiloxane bond-containing polymer compound having a recurring unit represented by the following formula (2) and a weight average molecular weight of 3,000 to 500,000,

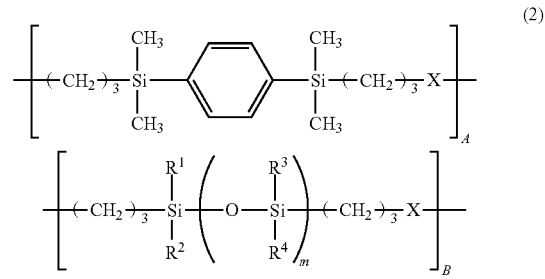

wherein $R^1$ to $R^4$ each represent a monovalent hydrocarbon group such as an alkyl group having 1 to 8 carbon atoms which may be the same or different from each other; "m" represents an integer of 1 to 100; B represents a positive number; A represents 0 or a positive number; and X represents a divalent organic group represented by the following formula (3),

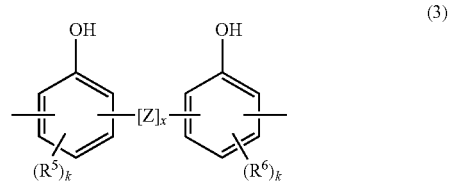

wherein Z represents a divalent organic group selected from either of

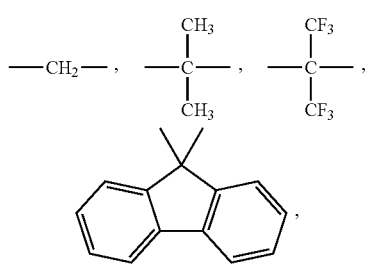

N represents 0 or 1, $R^5$ and $R^6$ each represent an alkyl group or an alkoxy group each having 1 to 4 carbon atoms which may be the same or different from each other; and "k" represents either one of 0, 1 or 2.

In this case, specific examples of $R^1$ to $R^4$ may be mentioned a methyl group, an ethyl group, a phenyl group, etc., "m" represents an integer of preferably 3 to 60, more preferably 8 to 40. Also, B/A represents 0 to 20, in particular 0.5 to 5.

Polymer of the Formula (4):

Epoxy group-containing silicone polymer compound having the recurring unit represented by the following formula (4) and a weight average molecular weight of 3,000 to 500,000,

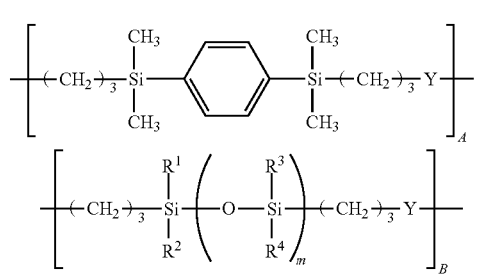

(4)

wherein $R^1$ to $R^4$ each represent a monovalent hydrocarbon group having 1 to 8 carbon atoms which may be the same or different from each other; "m" represents an integer of 1 to 100; B represents a positive number; A represents 0 or a positive number; and further Y represents a divalent organic group represented by the following formula (5),

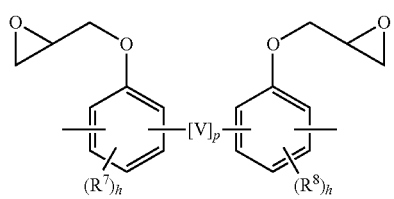

(5)

wherein V represents a divalent organic group selected from either of

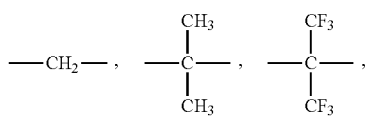

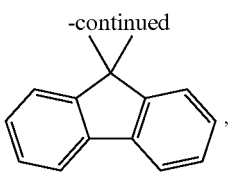

"p" represents 0 or 1, $R^7$ and $R^8$ each represent an alkyl group or an alkoxy group each having 1 to 4 carbon atoms, which may be the same or different from each other, and "h" represents either of 0, 1 or 2.

In this case, specific examples of $R^1$ to $R^4$ and "m" are the same as in the above-mentioned formula (2).

The thermosetting composition comprising the thermosetting modified siloxane polymer of the above-mentioned formula (2) or (4) as a main component contains one or more cross-linking agent selected from an amino condensed product modified by formalin or formalin-alcohol, a melamine resin, a urea resin, a phenol compound having two or more phenol groups, methylol groups or alkoxymethylol groups in the molecule in an average, and an epoxy compound having two or more epoxy groups in the molecule in an average in the case of the phenolic siloxane polymer of the formula (2) for its heat curing.

On the other hand, in the case of the epoxy modified siloxane polymer of the formula (4), the composition contains one or more cross-linking agent either of an epoxy compound having two or more epoxy groups in the molecule in an average, or a phenol compound having two or more phenol groups in the molecule in an average.

Here, the polyfunctional epoxy group to be used in the polymers of the formulae (2) and (4) is not particularly limited, and in particular, a bi-functional, a tri-functional, or a tetra-functional or more of the polyfunctional epoxy resins, for example, EOCN-1020, EOCN-102S, XD-1000, NC-2000-L, EPPN-201, GAN and NC6000 all available from Nippon Kayaku Co., Ltd., or a cross-linking agent represented by the following formula may be contained.

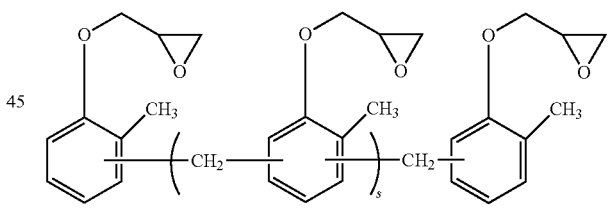

s = 3 ~ 6
EOCN-1020

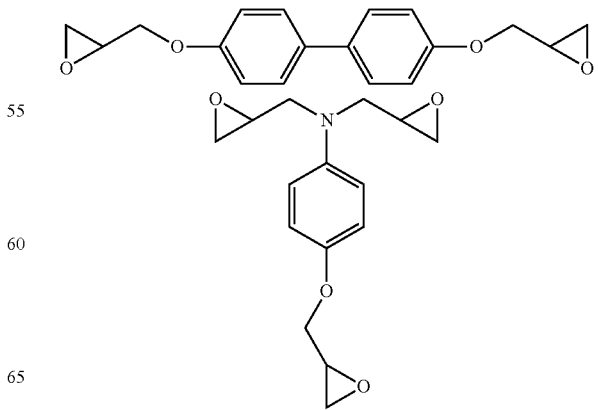

-continued

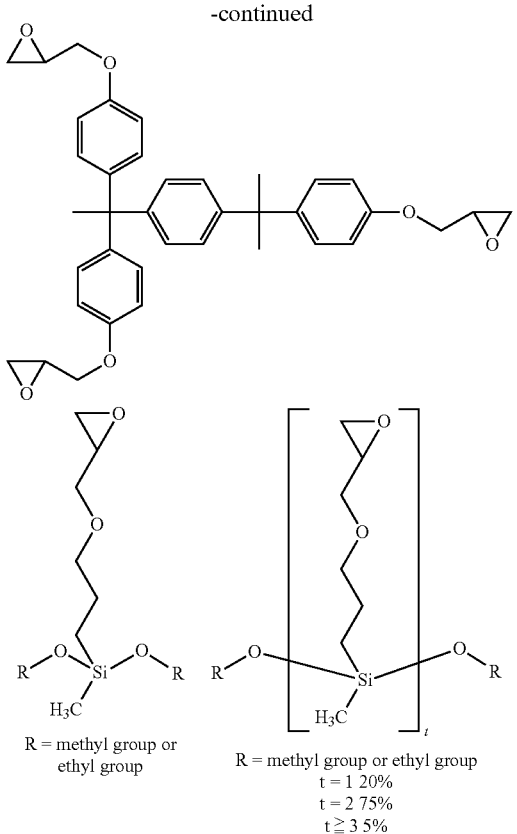

R = methyl group or ethyl group

R = methyl group or ethyl group
t = 1 20%
t = 2 75%
t ≧ 3 5%

When the above-mentioned thermosetting modified siloxane polymer is an epoxy modified siloxane polymer of the above-mentioned formula (4), as a cross-linking agent thereof, there may be mentioned a m- or p-series cresol-novolac resin, for example, EP-6030G available from Asahi Organic Chemicals Industry Co., Ltd., tri-functional phenol compound, for example, Tris-P-PA4 available from Honshu Chemical Industry Co., Ltd., and tetra-functional phenol compound, for example, TEP-TPA available from Asahi Organic Chemicals Industry Co., Ltd., etc.

A formulation amount of the cross-linking agent is 0.1 to 50 parts by mass, preferably 0.1 to 30 parts by mass, more preferably 1 to 20 parts by mass based on 100 parts by mass of the thermosetting modified siloxane polymer, and may be formulated in admixture of 2 kinds or 3 or more kinds.

To the above composition may be added a curing catalyst such as an acid anhydride in an amount of 10 parts by mass or less based on 100 parts by mass of thermosetting siloxane-modified polymer (C).

Also, the composition may be dissolved in a solvent, and coated on the support specifically by the method such as spin coating, roll coater, die coater, etc., to form a layer. In such a case, the solvent may be mentioned, for example, ketones such as cyclohexanone, cyclopentanone, methyl-2-n-amyl ketone, etc.; alcohols such as 3-methoxybutanol, 3-methyl-3-methoxybutanol, 1-methoxy-2-propanol, 1-ethoxy-2-propanol, etc.; ethers such as propylene glycol monomethyl ether, ethylene glycol monomethyl ether, propylene glycol monoethyl ether, ethylene glycol monoethyl ether, propylene glycol dimethyl ether, diethylene glycol dimethyl ether, etc.; esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, γ-butyrolactone, etc., and these may be used one kind alone, or in admixture of two or more kinds in combination.

Incidentally, to composition may be added the conventionally known antioxidant, a filler such as silica, etc., in an amount of 50 parts by mass or less based on 100 parts by mass of thermosetting siloxane-modified polymer (C) to further heighten heat resistance. Moreover, a surfactant may be added to improve coating uniformity.

It is preferable in the present application to add an antioxidant or a filler to one or more temporary adhesive layer of (B) and (C), particularly to the temporary layer (C) in the view of the improvement of the heat resistance and the mechanical strength.

Particularly, the antioxidant is preferably at least one compound selected from hindered phenol based compounds or hindered amine based compounds.

Hindered Phenol Based Compound;

The hindered phenol based compound used in the present invention is not restricted in particular, but the following hindered phenol based compounds are preferable.

1,3,5-trimethyl-2,4,6-tris(3,5-di-t-butyl-4-hydroxybenzyl)benzene (trade name: IRGANOX 1330), 2,6-di-t-butyl-4-methylphenol (trade name: Sumilizer BHT), 2,5-di-t-butyl-hydroquinone (trade name: Nocrac NS-7), 2,6-di-t-butyl-4-ethylphenol (trade name: Nocrac M-17), 2,5-di-t-amylhydroquinone (trade name: Nocrac DAH), 2,2'-methylenebis(4-methyl-6-t-butylphenol) (trade name: Nocrac NS-6), 3,5-di-t-butyl-4-hydroxy-benzylphosphonate-diethylester (trade name: IRGANOX 1222), 4,4'-thiobis(3-methyl-6-t-butylphenol) (trade name: Nocrac 300), 2,2'-methylenebis(4-ethyl-6-t-butylphenol) (trade name: Nocrac NS-5), 4-4'-butylidenebis(3-methyl-6-t-butylphenol) (Adekastab AO-40), 2-t-butyl-6-(3-t-butyl-2-hydroxy-5-methyl-benzyl)-4-methylphenylacrylate (trade name: Sumilizer GM), 2-[1-(2-hydroxy-3,5-di-t-pentylphenyl)ethyl]-4,6-di-t-pentylphenylacrylate (trade name: Sumilizer GS), 2,2'-methylenebis[4-methyl-6-(α-methyl-cyclohexyle)phenol], 4,4'-methylenebis(2,6-di-t-butylphenol) (trade name: SEENOX 226M), 4,6-bis(octylthiomethyl)-o-cresol (trade name: IRGANOX 1520L), 2,2'-ethylenebis(4,6-di-t-butylphenol), octadecyl-3-(3,5-di-t-butyl-4-hydroxyphenyl)propionate (trade name: IRGANOX 1076), 1,1,3-tris-(2-methyl-4-hydroxy-5-t-butylphenyl)butane (trade name: Adekastab AO-30), tetrakis[methylene-(3,5-di-t-butyl-4-hydroxyhydrocinnamate)]methane (trade name: Adekastab AO-60), triethyleneglycolbis[3-(3-t-butyl-5-methyl-4-hydroxyphenyl) propionate] (trade name: IRGANOX 245), 2,4-bis-(n-octylthio)-6-(4-hydroxy-3,5-di-t-butylanilino)-1,3,5-triazine (trade name: IRGANOX 565), N,N'-hexamethylenebis(3,5-di-t-butyl-4-hydroxy-hydrocinnamide) (trade name: IRGANOX 1098), 1,6-hexanediol-bis[3-(3,5-di-t-butyl-4-hydroxyphenyl)propionate] (trade name: IRGANOX 259), 2,2-thio-diethylenebis[3-(3,5-di-t-butyl-4-hydroxyphenyl) propionate] (trade name: IRGANOX 1035), 3,9-bis[2-[3-(3-t-butyl-4-hydroxy-5-methylphenyl)propionyloxy]1,1-dimethylethyl]2,4,8,10-tetraoxaspiro[5,5]undecane (trade name: Sumilizer GA-80), tris-(3,5-di-t-butyl-4-hydroxybenzyl) isocyanurate (trade name: IRGANOX 3114), bis(3,5-di-t-butyl-4-hydroxybenzyl ethyl phosphonate)calcium/polyethylene wax mixture (50:50) (trade name: IRGANOX 1425WL), isooctyl-3-(3,5-di-t-butyl-4-hydroxyphenyl)propionate (trade name: IRGANOX 1135), 4,4'-thiobis(6-t-butyl-3-methylphenol) (trade name: Sumilizer WX-R), 6-[3-(3-t-butyl- 4-hydroxy-5-methylphenyl)propoxy]-2,4,8,10-tetra-t-butyldibenz[d,f][1,3,2]dioxaphosphepine (trade name: Sumilizer GP), and others.

Hindered Amine Based Compound;

The hindered amine based compound used in the present invention is not restricted in particular, but the following hindered amine based compounds are preferable.

P,p'-dioctyldiphenylamine (trade name: IRGANOX 5057), phenyl-α-naphtylamine (trade name: Nocrac PA), poly(2,2,4-trimethyl-1,2-dihydroquinoline) (trade name: Nocrac 224, 224-5), 6-ethoxy-2,2,4-trimethyl-1,2-dihydroquinoline (trade name: Nocrac AW), N,N'-diphenyl-p-phenylenediamine (trade name: Nocrac DP), N,N'-di-β-naphtyl-p-phenylenediamine (trade name: Nocrac White), N-phenyl-N'-isopropyl-p-phenylenediamine (trade name: Nocrac 810NA), N,N'-diallyl-p-phenylenediamine (trade name: Nonflex TP), 4,4'(α,α-dimethylbenzyl)diphenylamine (trade name: Nocrac CD), p,p-toluenesulfonylaminodiphenylamine (trade name: Nocrac TD), N-phenyl-N'-(3-methachloryloxy-2-hydroxypropyl)-p-phenylenediamine (trade name: Nocrac G1), N-(1-methylheptyl)-N'-phenyl-p-phenylenediamine (trade name: Ozonon 35), N,N'-di-sec-butyl-p-phenylenediamine (trade name: Sumilizer BPA), N-phenyl-N'-1,3-dimethylbutyl-p-phenylenediamine (trade name: Antigene 6C), alkylated diphenylamine (trade name: Sumilizer 9A), succinate dimethyl-1-(2-hydroxyethyl)-4-hydroxy-2,2,6,6-tetramethylpiperidine polycondensate (trade name: Tinuvin 622 LD), poly[[6-(1,1,3,3-tetramethylbutyl)amino-1,3,5-triazine-2,4-diyl][(2,2,6,6-tetramethyl-4-piperidyl)imino]hexamethylene [(2,2,6,6-tetramethyl-4-piperidyl)imino]] (trade name: CHIMASSORB 944), N,N'-bis(3-aminopropyl) ethylenediamine-2,4-bis[N-butyl-N-(1,2,2,6,6-pentamethyl-4-piperidyl)amino]-6-chloro-1,3,5-triazine condensate (trade name: CHIMASSORB 119FL), bis(1-octyloxy-2,2,6,6-tetramethyl-4-piperidyl)sebacate (trade name: TINUVIN 123), bis(2,2,6,6-tetramethyl-4-piperydil)sebacate (trade name: TINUVIN 770), 2-(3,5-di-t-butyl-4-hydroxybenzyl)-2-n-butyl malonate bis(1,2,2,6,6-pentamethyl-4-piperidyl) (trade name: TINUVIN 144), bis(1,2,2,6,6-pentamethyl-4-piperidyl)sebacate (trade name: TINUVIN 765), tetrakis(1,2,2,6,6-pentamethyl-4-piperidyl)1,2,3,4-butanetetracarboxylate (trade name: LA-57), tetrakis(2,2,6,6-tetramethyl-4-piperidyl)1,2,3,4-butanetetracarboxylate (trade name: LA-52), a mixed ester compound of 1,2,3,4-butanetetracalboxylate, and 1,2,2,6,6-pentamethyl-4-piperidinol and 1-tridecanol (trade name: LA-62), a mixed ester compound of 1,2,3,4-butanetetracarboxylate, and 2,2,6,6-tetramethyl-4-piperidynol and 1-tridecanol (trade name: LA-67), a mixed ester compound of 1,2,3,4-butanetetracarboxylate, and 1,2,2,6,6-pentamethyl-4-piperidinol and 3,9-bis(2-hydroxy-1,1-dimethylethyl)-2,4,8,10-tetraoxaspiro[5.5]undecane (trade name: LA-63P), a mixed ester compound of 1,2,3,4-butanetetracarboxylate, 2,2,6,6-tetramethyl-4-piperidynol, and 3,9-bis(2-hydroxy-1,1-dimethylethyl)-2,4,8,10-tetraoxaspiro[5.5]undecane (trade name: LA-68LD), (2,2,6,6-tetramethylene-4-piperidyl)-2-propylenecarboxylate (trade name: Adekastab LA-82), (1,2,2,6,6-pentamethyl-4-piperidyl)-2-propylenecarboxylate (trade name: Adekastab LA-87), and others.

The antioxidant used is added preferably in an amount of 50 parts by mass or less, and more preferably in an amount between 0.01 and 10 parts by mass per 100 parts by mass of each temporary adhesive layer ((B) and (C)).

Also, the filler used in the present invention is for example fused silica and crystalline silica. In particular, fused silica in the form of a complete sphere is preferable in the view of lowering the viscosity of the compound, and moreover, spherical silica produced by the sol-gel method or the deflagration method is preferable. It is preferable to formulate a filler of which surface is treated by a coupling agent such as silane coupling agent and titanate coupling agent to improve the repletion. Such coupling agents are preferably silane coupling agents such as epoxy silane, for example γ-glycidoxypropyltrimethoxysilane, γ-glycidoxypropylmethyldiethoxysilane and β-(3,4-epoxycyclohexyl) ethyltrimethoxysilane, and amino silane, for example N-β (aminoethyl)-γ-aminopropyltrimethoxysilane, γ-aminopropyltriethoxysilane and N-phenyl-γ-aminopropyltrimethoxysilane, and mercapto silane, for example γ-mercapto silane. The formulation amount of the coupling agent used for treating the surface and the method of treating the surface is not limited here.

A preferable particle diameter of the filler is an average particle diameter ($d_{50}$: median size) between 0.1 μm and 5 μm, more preferably between 0.2 μm and 2 μm. Particularly, spherical silica having an average particle diameter between 0.1 μm and 5 μm produced by the sol-gel method or the deflagration method is preferable.

The filler is formulated preferably in an amount of 50 parts by mass or less, more preferably 10 to 50 parts by mass, based on 100 parts by mass of each temporary adhesive layer ((B) and (C)).

The thermosetting modified siloxane polymer layer (C) comprising the thermosetting modified siloxane polymer preferably has a film thickness at the time of curing of 15 to 150 μm depending on the steps at the wafer side, and more preferably to form a film with 20 to 120 μm. If the film thickness is 15 μm or more, it can sufficiently withstand to the grinding step for thinning the wafer, while if it is 150 μm or less, there is no fear of generating resin deformation in the heat treatment step such as TSV formation step, etc., and it can endure for practical use whereby it is preferred.

<Method for Manufacturing Thin Wafer>

The method for manufacturing a thin wafer of the present invention is characterized in that it uses the temporary adhesive material layer comprising three-layers of the non-silicone thermoplastic resin layer (A), the thermoplastic siloxane resin polymer layer (B) and the thermosetting siloxane-modified polymer layer (C) as an adhesive layer of the wafer having a semiconductor circuit, etc., and the support. A thickness of the thin wafer obtained by the manufacturing method of the present invention is typically 5 to 300 μm, more typically 10 to 100 μm.

The manufacturing method of a thin wafer of the present invention has the steps of (a) to (e).

[Step (a)]

Step (a) is a step, wherein for bonding a circuit-forming front surface of a wafer having the circuit-forming front surface and a non-circuit-forming back surface to a support through a temporary adhesive material layer used for the wafer processing laminate, the layer comprising a non-silicone thermoplastic resin layer (A), a thermoplastic siloxane resin polymer layer (B) and a thermosetting siloxane-modified polymer layer (C), after forming the polymer layer (B) on the thermosetting siloxane-modified polymer layer (C) which has been formed on the support by a spin coating method, to bond the support on which the polymer layers (C) and (B) have been formed, and the wafer to which a circuit has been attached and the resin layer (A) has been formed under vacuum. The wafer having the circuit-forming surface and the non-circuit-forming surface is a wafer one of the surfaces of which is a circuit-forming surface, and the other surface of which is a non-circuit-forming surface. The wafer to which the present invention can be applied is generally a semiconductor wafer. Examples of the semiconductor wafer may be mentioned not only a silicon wafer, but also a germanium wafer, a gallium-arsenic wafer, a gallium-phosphorus wafer, a gallium-arsenic-aluminum wafer, etc. A thickness of the wafer is not particularly limited, and typically 600 to 800 μm, more typically 625 to 775 μm.

As the support, a substrate such as a silicon wafer, a glass plate, a quartz wafer, etc., can be used and it is not particularly limited. In the present invention, it is not necessary to irradiate an energy beam to the temporary adhesive material layer through the support, and light transmittance of the support is not necessary.

The temporary adhesive layers (A), (B) and (C) may be formed on the wafer or the support by a film, respectively, or the respective solutions are each coated on the wafer or the support by the method of spin coating, etc. In this case, after the spin coating, depending on the volatile conditions of the solvent, it is applied for use after pre-baking at a temperature of 80 to 200° C.

The wafer and the support on which the temporary adhesive layer (A), layer (B) and layer (C) had been formed are formed as a bonded substrate through the layers (A), (B) and (C). At this time, at a temperature region of preferably 40 to 200° C., more preferably 60 to 180° C., and the substrate is uniformly pressure bonded under reduce pressure at the above temperature, a wafer processing laminate (laminated substrate) in which the wafer is bonded to the support is formed.

A wafer laminating device may be mentioned a commercially available wafer bonding device, for example, EVG520IS and 850TB manufactured by EVG, XBC300 manufactured by SUSS, etc.

[Step (b)]

Step (b) is a step of heat curing the above-mentioned polymer layer (C). After forming the above-mentioned wafer processing laminate (laminated substrate), it is heated at 120 to 220° C., preferably 150 to 200° C. for 10 minutes to 4 hours, preferably 30 minutes to 2 hours to cure the above-mentioned polymer layer (C).

[Step (c)]

Step (c) is a step to grind or polish the non-circuit-forming surface of the wafer bonded to the support, that is, a step to reduce the thickness of the wafer by grinding the wafer back surface side of the wafer processing laminate obtained by bonding in Step (a). The technique of the grinding process of the wafer back surface is not particularly limited, and conventionally known grinding techniques may be used. Grinding is preferably carried out by feeding water to the wafer and a grinding wheel (diamond, etc.) for cooling. The apparatus for grinding the wafer back surface may be mentioned, for example, DAG-810 (trade name) by DISCO Co., Ltd. Also, the wafer back surface side may be subjected to CMP polishing.

[Step (d)]

Step (d) is a step for processing the non-circuit-forming surface of the wafer processing laminate which has been ground, i.e., the non-circuit-forming surface of the wafer processing laminate which has been thinned by grinding the back surface. This step includes various processes which can be applied on the wafer level. Examples of which may be mentioned electrode formation, metal wiring formation and protective film formation, etc. More specifically, any conventionally known processes may be mentioned, including metal sputtering for forming electrodes, etc., wet etching for etching a sputtered metal layer, formation of a pattern by coating, exposure and development of a resist to be used as a mask of metal wiring formation, removal of the resist, dry etching, formation of metal plating, silicon etching for TSV formation, formation of an oxide film on the silicon front surface, etc.

[Step (e)]

Step (e) is a step for delaminating the wafer which has been processed in Step (c) from the wafer processing laminate, i.e., a step of delaminating the wafer from the wafer processing laminate after subjecting to various processing to the thinned wafer before dicing. This delaminating step is generally carried out under relatively low temperature conditions from room temperature to about 60° C., and it may be mentioned a method in which one of the wafer or the support of the wafer processing laminate is horizontally fixed, and the other is pulled up at a certain angle relative to the horizontal direction, and a method in which a protective film is adhered onto the ground surface of the ground wafer, and the wafer and the protective film are delaminating from the wafer processing laminate together by a peeling procedure, etc.

To the present invention, either of these delaminating methods can be applied, and a method in which one of the wafer or the support of the wafer processing laminate is horizontally fixed, and the other is pulled up at a certain angle relative to the horizontal direction, and a method in which a protective film is adhered onto the ground surface of the ground wafer, and the wafer and the protective film are delaminating from the wafer processing laminate together by a peeling procedure, etc., are more suitable. These delaminating methods are generally carried out at room temperature.

Also, (e) the step of delaminating the processed wafer from the support preferably contains (f) a step of adhering a dicing tape to the wafer surface of the processed wafer, (g) a step of subjecting a dicing tape surface to vacuum chucking to a chuck surface, and (h) a step of delaminating the support from the processed wafer by peeling-off at a temperature of the chuck surface in a temperature range of 10° C. to 100° C. By employing these steps, the support can be easily delaminated from the processed wafer, and the subsequent dicing step can be carried out easily.

Also, after the step of the above-mentioned (e) a step of delaminating the processed wafer from the support, (i) a step of removing the temporary adhesive material layer remained at the circuit-forming surface of the wafer delaminated therefrom is preferably carried out.

According to the above-mentioned Step (e), there is a case where a part of the temporary adhesive layer (A) is remained at the circuit-forming surface of the wafer delaminated from the support, and removal of the temporary adhesive layer (A) can be carried out, for example, by cleaning the wafer.

In the above-mentioned Step (1), any cleaning solution which can dissolve thermoplastic organopoly-siloxane-non-containing polymer which constitutes the layer (A) in the temporary adhesive material layer can be used, and specifically mentioned pentane, hexane, cyclohexane, decane, isononane, p-menthane, pinene, isododecane, limonene, etc. These solvents may be used one kind alone, or in admixture of two or more kinds in combination. When it is difficultly removable, a base or an acid may be added to the above-mentioned solvents. Examples of the usable bases may be mentioned an amine such as ethanolamine, diethanolamine, triethanolamine, triethylamine, ammonia, etc., and an ammonium salt such as tetramethyl ammonium hydroxide, etc. The acids which can be used may include an organic acid such as acetic acid, oxalic acid, benzenesulfonic acid, dodecylbenzenesulfonic acid, etc. An amount thereof to be added is 0.01 to 10% by mass, preferably 0.1 to 5% by mass with a concentration in the cleaning solution. In addition, an already existing surfactant may be added thereto to improve removability of the remained material. The cleaning method may be mentioned a method in which cleaning is carried out in a paddle by using the above-mentioned solution, a cleaning method by spraying, or a method in which an object is dipped in a cleaning liquid tank. A temperature at that time is suitably 10 to 80° C., preferably 15 to 65° C. It is possible, after dissolving the layer (A) by these dissolving solutions, cleaning with water or rinsing with an alcohol is finally carried out and drying treatment is carried out to obtain a thin wafer, if necessary.

EXAMPLES

In the following, the present invention is specifically explained by referring to Examples and Comparative Examples, but the present invention is not limited by the following Examples.

Resin Synthetic Example 1

In a four-necked flask, 90 parts of dimethylpolysiloxane which is a crude rubber state dimethylpolysiloxane (in the formula (1), "n" represents 9000) both of the molecular ends of which have been sealed by hydroxyl groups, and a viscosity of a 30% toluene solution thereof at 25° C. is 98,000 mPa·s, and 10 parts of a methylpolysiloxane resin comprising 0.75 mol of a $(CH_3)_3SiO_{1/2}$ unit and 1 mol of an $SiO_{4/2}$ unit, and containing 1.0 mol % of a hydroxyl group in 100 of a solid component were dissolved in 900 parts of toluene. To the obtained solution was added 1 part of 28% aqueous ammonia, and the mixture was subjected to condensation reaction under stirring at room temperature for 24 hours. Then, the resulting mixture was heated to 180° C. under the state of a reduced pressure, and toluene, condensed water, ammonia, etc., were removed therefrom to obtain a solidified partially condensed product. 900 parts of toluene was added to 100 parts of the partially condensed product to dissolve the product. To the solution was added 20 parts of hexamethyldisilazane, and the mixture was stirred at 130° C. for 3 hours to seal the remaining hydroxyl groups. Subsequently, the mixture was heated to 180° C. under the state of a reduced pressure, and the solvent, etc., were removed to obtain a solidified non-reactive partially condensed product. Moreover, after adding 900 parts of hexane to 100 parts of the non-reactive partially condensed product to dissolve the product, the solution was poured into 2000 parts of acetone, and the precipitated resin was recovered. Thereafter, hexane, etc., were removed under vacuum to obtain a dimethylpolysiloxane polymer having a weight average molecular weight of 900,000, with a low molecular weight component which is a molecular weight of 740 or less of 0.05% by mass.

In 80 g of isododecane was dissolved 20 g of the polymer, and the solution was filtered through 0.2 μm of a membrane filter to obtain an isododecane solution of the dimethylpolysiloxane polymer (B-1).

Resin Synthetic Example 2

In a four-necked flask, 95 parts of dimethylpolysiloxane which is a crude rubber state dimethylpolysiloxane (in the formula (1), "n" represents 9000) both of the molecular ends of which have been sealed by hydroxyl groups, and a viscosity of a 30% toluene solution thereof at 25° C. is 98,000 mPa·s, and 5 parts of a methylpolysiloxane resin comprising 0.75 mol of a $(CH_3)_3SiO_{1/2}$ unit and 1 mol of an $SiO_{4/2}$ unit, and containing 1.0 mol % of a hydroxyl group in 100 of a solid component were dissolved in 900 parts of toluene. To the obtained solution was added 1 part of 28% aqueous ammonia, and the mixture was subjected to condensation reaction under stirring at room temperature for 24 hours. Then, the resulting mixture was heated to 180° C. under the state of a reduced pressure, and toluene, condensed water, ammonia, etc., were removed therefrom to obtain a solidified partially condensed product. 900 parts of toluene was added to 100 parts of the partially condensed product to dissolve the product. To the solution was added 20 parts of hexamethyldisilazane, and the mixture was stirred at 130° C. for 3 hours to seal the remaining hydroxyl groups. Subsequently, the mixture was heated to 180° C. under the state of a reduced pressure, and the solvent, etc., were removed to obtain a solidified non-reactive partially condensed product. Moreover, after adding 900 parts of hexane to 100 parts of the non-reactive partially condensed product to dissolve the product, the solution was poured into 2000 parts of acetone, and the precipitated resin was recovered. Thereafter, hexane, etc., were removed under vacuum to obtain a dimethylpolysiloxane polymer having a weight average molecular weight of 800,000, with a low molecular weight component which is a molecular weight of 740 or less of 0.05% by mass.

In 80 g of isododecane was dissolved 20 g of the polymer, and the solution was filtered through 0.2 μm of a membrane filter to obtain an isododecane solution of the dimethylpolysiloxane polymer (B-2).

Resin Synthetic Example 3

In a four-necked flask were charged 1,000 g (3.38 mol) of octamethylcyclotetrasiloxane and 0.24 g (0.0015 mol) of hexamethyldisiloxane, and a temperature of the mixture was maintained at 110° C. Then, 4 g of 10% by mass tetrabutylphosphonium hydroxide siliconate was added to the mixture and the mixture was polymerized over 4 hours, and a post-treatment was carried out at 160° C. for 2 hours to obtain dimethylpolysiloxane.

When the ratio of the D unit and the M unit of the dimethylpolysiloxane was examined by the $^{29}Si$-NMR method, the D unit was 99.978% and the M unit was 0.022%, whereby it could be identified as the dimethylpolysiloxane having the following structure and the polymerization degree of about 9,000.

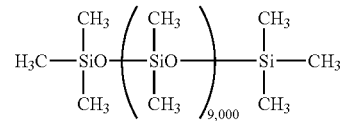

500 g of the dimethylpolysiloxane was dissolved in 500 g of hexane, and the solution was added to 2 L of acetone, and the precipitated resin was recovered. Thereafter, hexane, etc., were removed under vacuum to obtain a dimethylpolysiloxane polymer having a weight average molecular weight of 700,000, with a low molecular weight component which is a molecular weight of 740 or less of 0.05% by mass. In 80 g of p-menthane was dissolved 20 g of the polymer, and the solution was filtered through 0.2 μm of a membrane filter to obtain a p-menthane solution of the dimethylpolysiloxane (crude rubber) polymer (B-3).

Resin Synthetic Example 4

In a flask equipped with a stirrer, a thermometer, a nitrogen substituting device and a reflux condenser were charged 43.1 g of 9,9'-bis(3-allyl-4-hydroxyphenyl)fluorene (M-1), 29.5 g of the organohydrogen siloxane represented by the average structural formula (M-3), 135 g of toluene and 0.04 g of chloroplatinic acid, and the mixture was raised to 80° C. Thereafter, 17.5 g of 1,4-bis(dimethylsilyl)benzene (M-5) was added dropwise to the mixture in the flask over 1 hour. At this time, an inner temperature of the flask was increased to 85° C. After completion of the dropwise addition, the mixture was further matured at 80° C. for 2 hours, then, toluene was removed and 80 g of cyclohexanone was added to obtain a resin solution with a concentration of the resin solid component of 50% by mass and containing cyclohexanone as a solvent. When the molecular weight of the resin component in the solution was measured by the GPC, the weight average molecular weight was 45,000 in terms of the polystyrene. Further, to 50 g of the resin solution were added 7.5 g of EOCN-1020 (available from Nippon Kayaku Co., Ltd.) which is an epoxy cross-linking agent as the cross-linking agent, 0.2 g of bis(t-butylsulfonyl)diazomethane (available from Wako Pure Chemical Industries, Ltd. BSDM) as the curing catalyst, further, 0.1 g of AO-60 as the antioxidant, and the mixture was filtered through 0.2 μm of a membrane filter to obtain the resin solution (C-1).

Resin Synthetic Example 5

In a 5 L flask equipped with a stirrer, a thermometer, a nitrogen substituting device and a reflux condenser, 84.1 g of the epoxy compound (M-2) was dissolved in 600 g of toluene, and 294.6 g of the compound (M-3) and 25.5 g of the compound (M-4) were added to the solution, and the resulting mixture was heated to 60° C. Thereafter, 1 g (5% by mass) of a carbon carried platinum catalyst was added to the mixture, and after confirming that an inner reaction temperature was raised to became 65 to 67° C., the mixture was further heated to 90° C. and matured for 3 hours. Then, after cooling the mixture to room temperature, 600 g of methyl isobutyl ketone (MIBK) was added to the mixture, and this reaction mixture was filtered under pressure to remove the platinum catalyst. The solvent in the resin solution was removed under reduce pressure, and 270 g of propylene glycol monomethyl ether acetate (PGMEA) was added to the residue to obtain the resin solution having a concentration of the solid component of 60% by mass with PGMEA as a solvent. When the molecular weight of the resin in this resin solution was measured by the GPC, the weight average molecular weight was 28,000 in terms of the polystyrene. Further, to 100 g of the resin solution were added 9 g of TEP-TPA (available from Asahi Organic Chemicals Industry Co., Ltd.) which is a tetra-functional phenol compound and 0.2 g of tetrahydrophthalic anhydride (available from New Japan Chemical Co., Ltd., RIKACID HH-A), and the mixture was filtered through 0.2 μm of a membrane filter to obtain the resin solution (C-2).

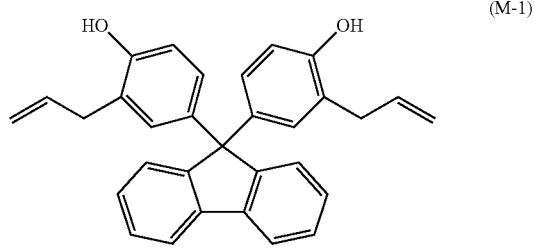

(M-1)

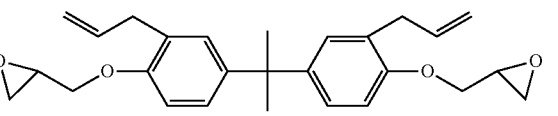

(M-2)

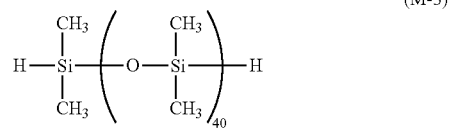

(M-3)

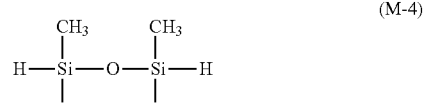

(M-4)

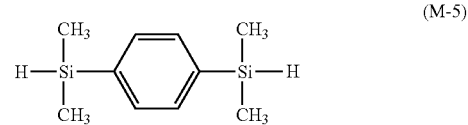

(M-5)

Resin Synthetic Example 6

0.2 g of 4-4'-butylidenebis(3-methyl-6-t-butylphenol) (Adekastab AO-40) was added to 100 g of the above resin solution (C-2) and dissolved, and further filtered through 0.2 μm of a membrane filter to obtain a resin solution (C-3).

Resin Synthetic Example 7

0.1 g of poly[[6-(1,1,3,3-tetramethylbutyl)amino-1,3,5-triazine-2,4-diyl][(2,2,6,6-tetramethyl-4-piperidyl)imino] hexamethylene[(2,2,6,6-tetramethyl-4-piperidyl)imino]] (trade name: CHIMASSORB 944, available from BASF) was added to 100 g of the above resin solution (B-1) and dissolved, and further filtered through 0.2 μm of a membrane filter to obtain a resin solution (B-4).

Resin Synthetic Example 8

20 g of Aerosil 8100 (silane coupling treated fumed silica available from Japan Aerosil, average particle diameter 500 nm) was added to 100 g of the above resin solution (C-1) and mixed to obtain a resin resolution (C-4).

Resin Solution Preparation Example 1

In 180 g of isononane was dissolved 20 g of hydrogen-added polystyrene type thermoplastic resin SEPTON4033 (available from Kuraray Co., Ltd.) to obtain an isononane solution of 10% by mass SEPTON4033.
The obtained solution was filtered through 0.2 μm of a membrane filter to obtain an isononane solution (A-1) of thermoplastic organopolysiloxane-non-containing polymer.

Examples 1 to 6 and Comparative Examples 1 to 3

Using 200 mm silicon wafer (thickness: 725 μm) having copper posts with a height of 10 μm and a diameter of 40 μm distributed over its entire front surface, a material corresponding to the layer (A) was spin coated on the bump-formed surface of the wafer and heated by a hot plate at 150° C. for 5 minutes with the thickness shown in Table 1. On the other hand, a glass plate having a diameter of 200 mm (thickness: 500 μm) was used as a support, and onto the glass support was firstly coated the polymer solution corresponding to the layer (C) by spin coating and heated by a hot plate also at 150° C. with the thickness shown in Table 1. Thereafter, the solution of the thermoplastic polyorganosiloxane polymer corresponding to the layer (B) was also coated on the layer (C) formed on the glass support by spin coating with the thickness shown in Table 1. It was further heated on a hot plate at 150° C. for 3 minutes. As mentioned above, the silicon wafer having the thermoplastic organopolysiloxane-non-containing layer (A) and the glass plate having the layer (C) comprising the thermosetting modified siloxane polymer and the layer (B) formed on the layer (C) were adhered so that the respective resin surfaces were mated together under the conditions shown in Table 1 in a vacuum adhering apparatus to prepare a laminate (pressure bonding conditions).

Here, a glass plate was used as a support for judging anomaly after adhering the substrate with naked eyes, but a substrate which does not transmit light such as a wafer can be also used.

Thereafter, with regard to the bonded substrate, the following tests were carried out, and the results of Examples and Comparative Examples were shown in Table 1. Also, the evaluations were carried out by the order as mentioned below, and when the result became anomaly (the judgment is "poor") during the tests, the evaluation thereafter was stopped.

—Adhesive Test—

A wafer with a diameter of 200 mm was bonded by using a wafer bonding apparatus EVG520IS of EVG. Bonding was carried out at a bonding temperature as shown in Table 1, a chamber internal pressure at the bonding of $10^{-3}$ mbar or less, and a load of 5 kN. After bonding, the substrate was once heated in an oven at 180° C. for 1 hour to heighten curing degree of the layer (C). After cooling to room temperature, the adhered state of the interface was confirmed with naked eyes. The sample was evaluated good when no defectives like bubbles at the interface was found and showed with "good", and poor when defectives were found and showed with "poor".

—Back Surface Grinding Resistance Test—

The back surface of a silicon wafer was ground by a grinder (DAG810 product of DISCO. Co., Ltd.) having a diamond abrasive wheel. After the wafer was ground to a final thickness of the substrate of 50 μm, it was observed for the presence or absence of defectives such as cracks and dislodgment under an optical microscope (100-fold). The sample was evaluated good when no defectives was found and showed with "good", and poor when defectives were found and showed with "poor".

—Heat Resistance Test—

The laminate after the back surface of the silicon wafer had been ground was placed in an oven at 200° C. for 2 hours under nitrogen atmosphere, and then, heated on a hot plate at 260° C. for 10 minutes. Then, the presence or absence of anomaly in the appearance was examined. The sample was evaluated good when no appearance anomalies was found and showed with "good", substantially good when no appearance of anomalies such as voids, blister of the wafer, breakage of the wafer, etc., was found while slight distortion of the wafer was observed and showed with "moderate" and poor when appearance of anomalies such as voids, blister of the wafer, breakage of the wafer, etc., were found and showed with "poor". Further, the sample which was evaluated "good" was heated at 300° C. for 10 minutes and the appearance was examined. The sample was evaluated very good when no appearance anomalies was found and showed with "very good".

—Delaminatability Test—

The ability of delamination of the substrate was carried out as follows. First, the wafer finished the heat resistance test was once set to a spin coater, the wafer was rotated with 1,000 rpm for 60 seconds, and during 60 seconds, isononane was continued to be applied to the wafer edge from a nozzle for edge bed rinsing by a spin coating, and thereafter, the wafer was continued to be rotated at 1,000 rpm for 10 seconds to dry the wafer edge portion. Thereafter, a dicing tape was affixed to the wafer side thinned to 50 μm of the bonded substrate by using a dicing frame, and the dicing tape surface was set to the chuck platen by vacuum chucking. Thereafter, the glass substrate was delaminated by pulling it up at one point of the glass using a pair of tweezers at room temperature. When it could be delaminated without cracking 50 μm of the wafer, it was showed with "good", and when it could be delaminated particularly easy, it was showed with "very good". When the isononane edge bed rinsing for 60 seconds was insufficient and it could be delaminated by additional isononane edge bed rinsing for 120 seconds, it was showed with "moderate", and when anomalies such as cracks were generated, it was evaluated poor and showed with "poor".

—Clean-Up Test—

The 200 mm wafer (which had been exposed to the heat resistance test conditions) mounted on the dicing frame via the dicing tape after completion of the above-mentioned delaminatability test was set on a spin coater, with the adhesive layer upside. Isononane was sprayed for 3 minutes as a cleaning solution, and then, rinsing was carried out by spraying isopropyl alcohol (IPA) while rotating the wafer. Thereafter, appearance of the wafer was observed, and the presence or absence of the remaining adhesive material resin was checked with naked eyes. The sample was evaluated good in the absence of residual resin and showed with "good", and poor in the presence of the residual resin and showed with "poor".

—Peeling Force Test—

Using a 200 mm silicon wafer (thickness: 725 μm), a material corresponding to the layer (A) was spin coated on the bump-formed surface of the wafer and heated by a hot plate at 150° C. for 5 minutes to form a film with the thickness shown in Table 1. Thereafter, the solution of the thermoplastic polyorganosiloxane polymer corresponding to the layer (B) was coated on the layer (A) formed on the silicon wafer also by spin coating, and further heated by a hot plate at 150° C. for 3 minutes to form a film with a thickness of 2 μm. Moreover, the polymer solution corresponding to the layer (C) was coated on the layer (B) by spin coating and heated by a hot plate also at 150° C. to form a film with a thickness of 50 μm on a silicon wafer. Then, the sample was cured in an oven at 180° C. for 1 hour.

Thereafter, on the above layer (C) was adhered five polyimide tapes with a size of 150 mm length and 25 mm width, and the temporary adhesive material layer at which no tape had been adhered was removed. By using AUTOGRAPH (AG-1) manufactured by Shimadzu Corporation, the tapes were peeled off from one end thereof with 180° peeling and a length of 120 mm with a velocity of 300 mm/minute, and an average of the forces applied to that time (120 mm stroke×5 times) was made a peeling force of the temporary adhesive layer (B).

TABLE 1

| | Example 1 | Example 2 | Example 3 | Example 4 | Example 5 | Example 6 | Comparative example 1 | Comparative example 2 | Comparative example 2 |
|---|---|---|---|---|---|---|---|---|---|
| Resin layer (A) | A-1 | A-1 | A-1 | A-1 | A-1 | A-1 | A-1 | A-1 | A-1 |
| Film thickness of layer (A) | 2 μm | 3 μm | 2 μm | 3 μm | 2 μm | 3 μm | 3 μm | 2 μm | 2 μm |
| Resin layer (B) | B-1 | B-2 | B-1 | B-2 | B-4 | B-2 | B-3 | B-3 | none |
| Film thickness of layer (B) | 1 μm | 1 μm | 5 μm | 1 μm | 2 μm | 1 μm | 1 μm | 5 μm | — |
| Peel force of layer (B) | 5 gf | 10 gf | 5 gf | 10 gf | 5 gf | 10 gf | <2 gf | <2 gf | — |
| Resin layer (C) | c-1 | c-2 | c-2 | c-3 | c-2 | c-4 | c-1 | c-2 | c-1 |
| Film thickness of layer (C) | 50 μm | 70 μm | 90 μm | 70 μm | 90 μm | 70 μm | 70 μm | 90 μm | 50 μm |
| Adhesion temperature | 140° C. | 120° C. | 120° C. | 120° C. | 120° C. | 120° C. | 140° C. | 120° C. | 140° C. |
| Adhesiveness | good | good | good | good | good | good | good | poor | good |
| Back surface grinding resistance | good | good | good | good | good | good | poor | poor | good |
| Heat resistance | good | good | good | very good | good | very good | poor | poor | very good |
| Peeling property | good | good | good | good | good | good | very good | very good | poor |
| Clean-up property | good | good | good | good | good | good | good | good | — |

Peel forces of layer (B) of Examples 1 to 6 were 5 gf or 10 gf, but those of Comparative Examples 1 and 2 were less than 2 gf, so that in Examples 1 to 6, there is no fear of causing slippage of the wafer at the time of grinding the wafer. Also, Examples 1 to 6 are particularly excellent in back surface grinding resistance as compared with those of Comparative Examples 1 and 2, so that a thin wafer can be markedly easily prepared.

Moreover, by adding an antioxidant and a filler, a product excelling in heat resistance and mechanical strength was obtained.

It is to be noted that the present invention is not limited to the above described embodiments. The above embodiments are exemplifications, and any case having a configuration that is substantially the same with the technical idea claimed in the present invention and showing a similar advantageous effect is comprised in the scope of the present invention.

The invention claimed is:

1. A wafer processing laminate comprising a support, a temporary adhesive material layer formed thereon and a wafer laminated on the temporary adhesive material layer, where the wafer has a circuit-forming front surface and a back surface to be processed,
wherein the temporary adhesive material layer comprises a three-layered structure composite temporary adhesive material layer comprising a first temporary adhesive layer of a non-silicone thermoplastic resin layer (A) releasably adhered on a surface of the wafer, a second temporary adhesive layer of a thermoplastic siloxane resin polymer layer (B) laminated on the first temporary adhesive layer, and a third temporary adhesive layer of a thermosetting siloxane-modified polymer layer (C) laminated on the second temporary adhesive layer and releasably adhered to the support.

2. The wafer processing laminate according to claim 1, wherein a film thickness of the second temporary adhesive layer comprising the thermoplastic siloxane resin polymer layer (B) is 0.1 μm to 10 μm, and a film thickness of the third temporary adhesive layer comprising the thermosetting siloxane-modified polymer layer (C) is 15 μm to 150 μm.

3. The wafer processing laminate according to claim 1, wherein the non-silicone thermoplastic resin layer (A) of the first temporary adhesive layer is a non-silicone thermoplastic elastomer.

4. The wafer processing laminate according to claim 1, wherein the thermoplastic siloxane resin polymer layer (B) is a material in which an organopolysiloxane resin containing an $R^{21}R^{22}R^{23}SiO_{1/2}$ unit, where $R^{21}$, $R^{22}$ and $R^{23}$ each represent an unsubstituted or substituted monovalent hydrocarbon group having 1 to 10 carbon atoms or a hydroxyl group, and a $SiO_{4/2}$ unit, with a molar ratio of the $R^{21}R^{22}R^{23}SiO_{1/2}$ unit/$SiO_{4/2}$ unit of 0.6 to 1.7, and an organopolysiloxane represented by the following formula (1) are partially subjected to dehydration condensation, a ratio of the organopolysiloxane and the organopolysiloxane resin to be subjected to dehydration condensation of 99:1 to 50:50, and a weight average molecular weight of 200,000 to 1,500,000,

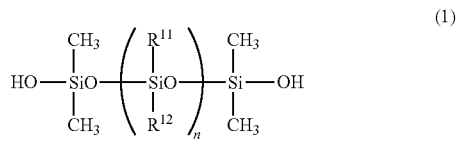

(1)

wherein $R^{11}$ and $R^{12}$ are each unsubstituted or substituted monovalent hydrocarbon group having 1 to 10 carbon atoms, and "n" represents 5,000 to 10,000.

5. The wafer processing laminate according to claim 1, wherein a 180° peeling force of a test piece having a width of 25 mm of the thermoplastic siloxane resin polymer layer (B) is 2 gf or more.

6. The wafer processing laminate according to claim 1, wherein the thermosetting siloxane-modified polymer layer (C) is a cured product layer of a composition containing 100 parts by mass of a siloxane bond-containing polymer having a recurring unit represented by the following formula (2) and a weight average molecular weight of 3,000 to 500,000, and, as a cross-linking agent, 0.1 to 50 parts by mass of one or more selected from an amino condensed product modified by formalin or formalin-alcohol, a melamine resin, a urea resin, a phenol compound having two or more phenol groups, methylol groups or alkoxymethylol groups in the molecule in an average, and an epoxy compound having two or more epoxy groups in the molecule in an average,

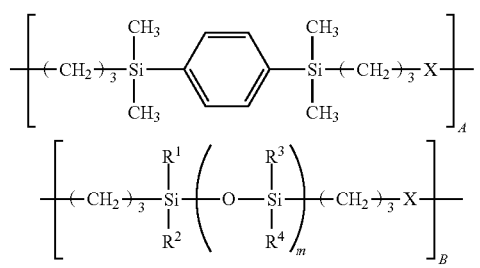

(2)

wherein $R^1$ to $R^4$ each represent a monovalent hydrocarbon group having 1 to 8 carbon atoms which may be the same or different from each other; "m" represents an integer of 1 to 100; B represents a positive number; A represents 0 or a positive number; and X represents a divalent organic group represented by the following formula (3),

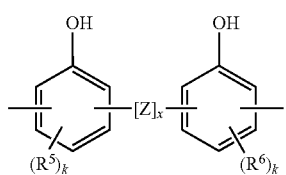

(3)

wherein Z represents a divalent organic group selected from either of

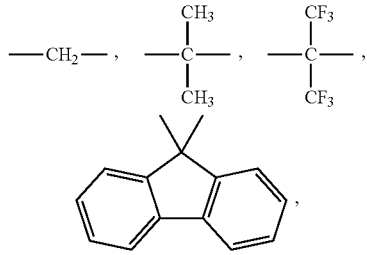

N represents 0 or 1; $R^5$ and $R^6$ each represent an alkyl group or an alkoxy group each having 1 to 4 carbon atoms and each may be the same or different from each other; and "k" represents either of 0, 1 and 2.

7. The wafer processing laminate according to claim 1, wherein the thermosetting siloxane-modified polymer layer (C) is a cured product layer of a composition containing 100 parts by mass of a siloxane bond-containing polymer having a recurring unit represented by the following formula (4) and a weight average molecular weight of 3,000 to 500,000, and, as a cross-linking agent, 0.1 to 50 parts by mass of one or more selected from a phenol compound having two or more phenol groups in the molecule in an average, and an epoxy compound having two or more epoxy groups in the molecule in an average,

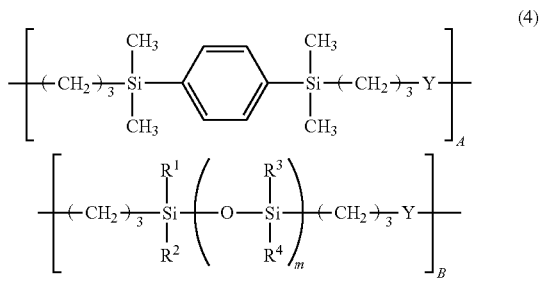

(4)

wherein $R^1$ to $R^4$ each represent a monovalent hydrocarbon group having 1 to 8 carbon atoms which may be the same or different from each other; "m" represents an integer of 1 to 100; B represents a positive number; A represents 0 or a positive number; and further Y represents a divalent organic group represented by the following formula (5),

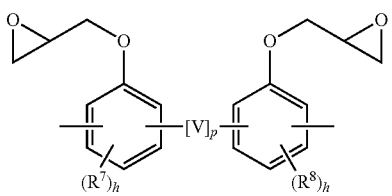

(5)

wherein V represents a divalent organic group selected from either of

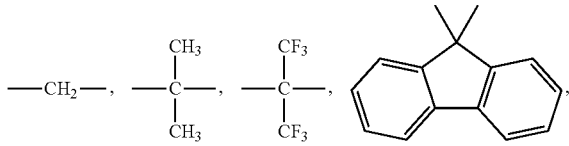

"p" represents 0 or 1, $R^7$ and $R^8$ each represent an alkyl group or an alkoxy group each having 1 to 4 carbon atoms, which may be the same or different from each other, and "h" represents either of 0, 1 or 2.

8. The wafer processing laminate according to claim 1, wherein one or more of the thermoplastic siloxane resin polymer layer (B) and the thermosetting siloxane-modified polymer layer (C) further comprises an antioxidant or a filler.

9. A method for manufacturing a thin wafer which comprises the steps of:
(a) a step, wherein for bonding a circuit-forming front surface of the wafer having the circuit-forming front surface and a non-circuit-forming back surface to a support through a temporary adhesive material layer used for the wafer processing laminate according to claim 1, the layer comprising the non-silicone thermoplastic resin layer (A), the thermoplastic siloxane resin polymer layer (B) and the thermosetting siloxane-modified polymer layer (C), after forming the thermoplastic siloxane polymer layer (B) by a spin coating method on the thermosetting siloxane-modified polymer layer (C) which has been formed on the support, to bond the support on which the polymer layers (C) and (B) have been formed, and the wafer to which a circuit has been attached and the resin layer (A) has been formed under vacuum,
(b) a step of heat curing the polymer layer (C), (c) a step of grinding or polishing the non-circuit-forming surface of the wafer bonded to the support,
(d) a step of processing the non-circuit-forming surface of the wafer, and
(e) a step of delaminating the processed wafer from the support.

10. The method for manufacturing a thin wafer according to claim 9, wherein (e) the step of delaminating the processed wafer from the support comprises
(f) a step of adhering a dicing tape to the wafer surface of the processed wafer,
(g) a step of subjecting a dicing tape surface to vacuum chucking to a chuck surface, and
(h) a step of delaminating the support from the processed wafer by peeling-off at a temperature of the chuck surface in a temperature range of 10° C. to 100° C.

11. The method for manufacturing a thin wafer according to claim 9, wherein
(i) a step of removing the temporary adhesive material layer remained at the circuit-forming surface of the delaminated wafer is carried out,
after (e) the step of delaminating the processed wafer from the support.

12. A wafer processing member comprising a support and a temporary adhesive material layer formed thereon, on the temporary adhesive material layer of which a wafer is to be temporary adhered, where the wafer has a circuit-forming front surface and a back surface to be processed, wherein the temporary adhesive material layer comprises a three-layered structure composite temporary adhesive material layer comprising a first temporary adhesive layer of a non-silicone thermoplastic resin layer (A) releasably adherable on a surface of the wafer, a second temporary adhesive layer of a thermoplastic siloxane resin polymer layer (B) laminated on the first temporary adhesive layer, and a third temporary adhesive layer of a thermosetting siloxane-modified polymer layer (C) laminated on the second temporary adhesive layer and releasably adhered to the support.

13. The wafer processing member according to claim 12, wherein the thermoplastic siloxane resin polymer layer (B) is a material in which an organopolysiloxane resin containing an $R^{21}R^{22}R^{23}SiO_{1/2}$ unit, where $R^{21}$, $R^{22}$ and $R^{23}$ each represent an unsubstituted or substituted monovalent hydrocarbon group having 1 to 10 carbon atoms or a hydroxyl group,
and a $SiO_{4/2}$ unit, with a molar ratio of the $R^{21}R^{22}R^{23}SiO_{1/2}$ unit/$SiO_{4/2}$ unit of 0.6 to 1.7, and an organopolysiloxane represented by the following formula (1) are partially subjected to dehydration condensation, a ratio of the organopolysiloxane and the organopolysiloxane resin to be subjected to dehydration condensation of 99:1 to 50:50, and a weight average molecular weight of 200,000 to 1,500,000,

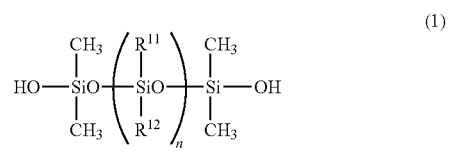

wherein $R^{11}$ and $R^{12}$ are each unsubstituted or substituted monovalent hydrocarbon group having 1 to 10 carbon atoms, and "n" represents 5,000 to 10,000.

14. The wafer processing member according to claim 12, wherein a 180° peeling force of a test piece having a width of 25 mm of the thermoplastic siloxane resin polymer layer (B) is 2 gf or more.

15. The wafer processing member according to claim 12, wherein the thermosetting siloxane-modified polymer layer (C) is a cured product layer of a composition containing 100 parts by mass of a siloxane bond-containing polymer having a recurring unit represented by the following formula (2) and a weight average molecular weight of 3,000 to 500,000, and, as a cross-linking agent, 0.1 to 50 parts by mass of one or more selected from an amino condensed product modified by formalin or formalin-alcohol, a melamine resin, a urea resin, a phenol compound having two or more phenol groups, methylol groups or alkoxymethylol groups in the molecule in an average, and an epoxy compound having two or more epoxy groups in the molecule in an average,

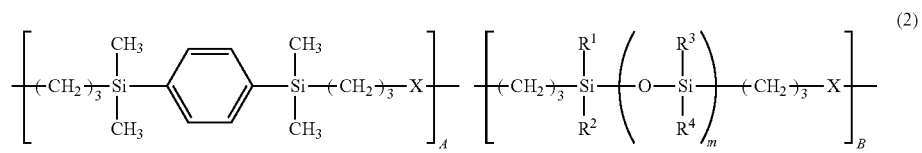

wherein $R^1$ to $R^4$ each represent a monovalent hydrocarbon group having 1 to 8 carbon atoms which may be the same or different from each other; "m" represents an integer of 1 to 100; B represents a positive number; A represents 0 or a positive number; and X represents a divalent organic group represented by the following formula (3),

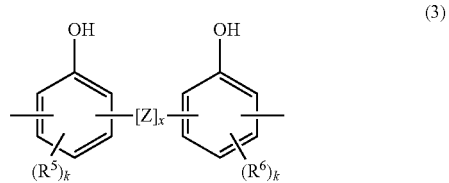

wherein Z represents a divalent organic group selected from either of

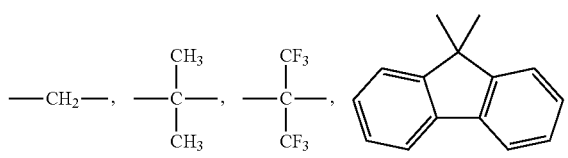

N represents 0 or 1; $R^5$ and $R^6$ each represent an alkyl group or an alkoxy group each having 1 to 4 carbon atoms and each may be the same or different from each other; and "k" represents either of 0, 1 and 2.

16. The wafer processing member according to claim 12, wherein the thermosetting siloxane-modified polymer layer (C) is a cured product layer of a composition containing 100 parts by mass of a siloxane bond-containing polymer having a recurring unit represented by the following formula (4) and a weight average molecular weight of 3,000 to 500,000, and, as a cross-linking agent, 0.1 to 50 parts by mass of one or more selected from a phenol compound having two or more phenol groups in the molecule in an average, and an epoxy compound having two or more epoxy groups in the molecule in an average,

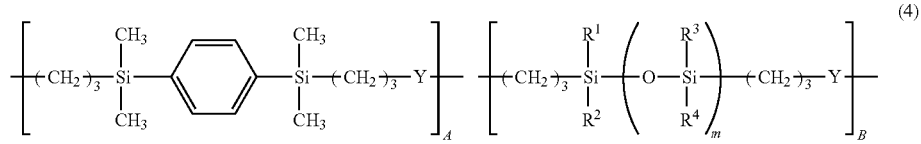

wherein $R^1$ to $R^4$ each represent a monovalent hydrocarbon group having 1 to 8 carbon atoms which may be the same or different from each other; "m" represents an integer of 1 to 100; B represents a positive number; A represents 0 or a positive number; and further Y represents a divalent organic group represented by the following formula (5),

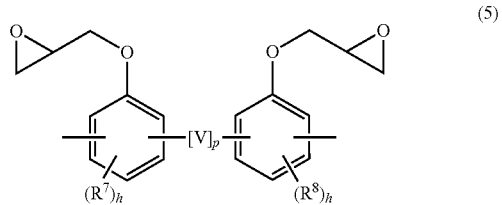

wherein V represents a divalent organic group selected from either of

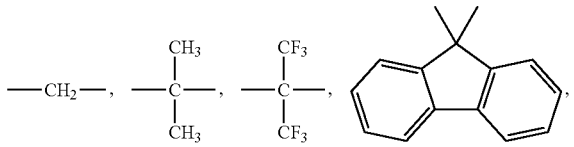

"p" represents 0 or 1, $R^7$ and $R^8$ each represent an alkyl group or an alkoxy group each having 1 to 4 carbon atoms, which may be the same or different from each other, and "h" represents either of 0, 1 or 2.

17. A temporary adhering material for processing a wafer which is a material for temporary adhering the wafer to a support, where the wafer has a circuit-forming front surface and a back surface to be processed, wherein the temporary adhering material for processing wafer comprises a three-layered structure composite temporary adhesive material layer comprising a first temporary adhesive layer of a non-silicone thermoplastic resin layer (A) releasably adherable to the front surface of the wafer, a second temporary adhesive layer of a thermoplastic siloxane polymer layer (B) laminated on the first temporary adhesive layer, and a third temporary adhesive layer of a thermosetting siloxane-modified polymer layer (C) laminated on the second temporary adhesive layer and releasably adherable to the support.

18. The temporary adhering material for processing a wafer according to claim 17, wherein the thermoplastic siloxane resin polymer layer (B) is a material in which an organopolysiloxane resin containing an $R^{21}R^{22}R^{23}SiO_{1/2}$ unit, where $R^{21}$, $R^{22}$ and $R^{23}$ each represent an unsubstituted or substituted monovalent hydrocarbon group having 1 to 10 carbon atoms or a hydroxyl group, and a $SiO_{4/2}$ unit, with a molar ratio of the $R^{21}R^{22}R^{23}SiO_{1/2}$ unit/$SiO_{4/2}$ unit of 0.6 to 1.7, and an organopolysiloxane represented by the following formula (1) are partially subjected to dehydration condensation, a ratio of the organopolysiloxane and the organopolysiloxane resin to be subjected to dehydration condensation of 99:1 to 50:50, and a weight average molecular weight of 200,000 to 1,500,000,

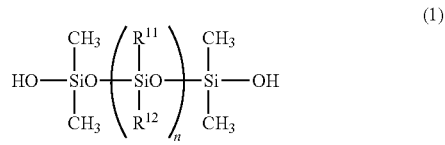

wherein $R^{11}$ and $R^{12}$ are each unsubstituted or substituted monovalent hydrocarbon group having 1 to 10 carbon atoms, and "n" represents 5,000 to 10,000.

19. The temporary adhering material for processing a wafer according to claim 17, wherein a 180° peeling force of a test piece having a width of 25 mm of the thermoplastic siloxane resin polymer layer (B) is 2 gf or more.

20. The temporary adhering material for processing a wafer according to claim 17, wherein the thermosetting siloxane-modified polymer layer (C) is a cured product layer of a composition containing 100 parts by mass of a siloxane bond-containing polymer having a recurring unit represented by the following formula (2) and a weight average molecular weight of 3,000 to 500,000, and, as a cross-linking agent, 0.1 to 50 parts by mass of one or more selected from an amino condensed product modified by formalin or formalin-alcohol, a melamine resin, a urea resin, a phenol compound having two or more phenol groups, methylol groups or alkoxymethylol groups in the molecule in an average, and an epoxy compound having two or more epoxy groups in the molecule in an average, each may be the same or different from each other; and "k" represents either of 0, 1 and 2.

21. The temporary adhering material for processing a wafer according to claim 17, wherein the thermosetting siloxane-modified polymer layer (C) is a cured product layer of a composition containing 100 parts by mass of a siloxane bond-containing polymer having a recurring unit represented by the following formula (4) and a weight average molecular weight of 3,000 to 500,000, and, as a cross-linking agent, 0.1 to 50 parts by mass of one or more selected from a phenol compound having two or more phenol groups in the molecule in an average, and an epoxy compound having two or more epoxy groups in the molecule in an average,

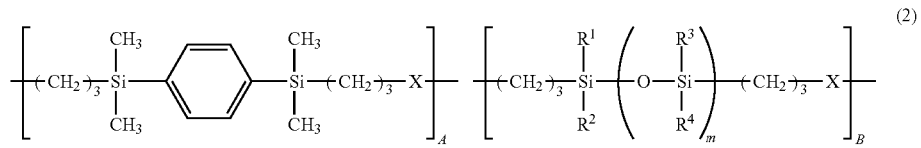

(2)

wherein $R^1$ to $R^4$ each represent a monovalent hydrocarbon group having 1 to 8 carbon atoms which may be the same or different from each other; "m" represents an integer of 1 to 100; B represents a positive number;

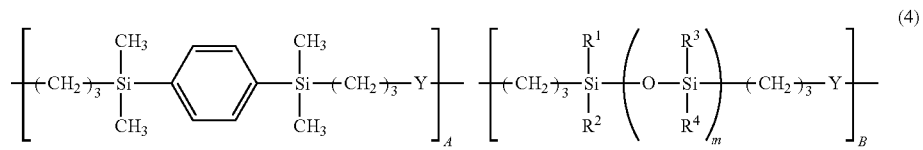

(4)

A represents 0 or a positive number; and X represents a divalent organic group represented by the following formula (3),

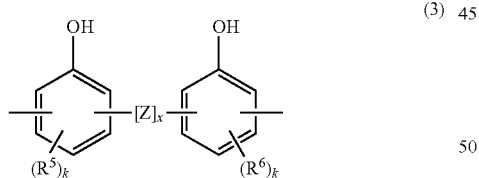

(3)

wherein Z represents a divalent organic group selected from either of

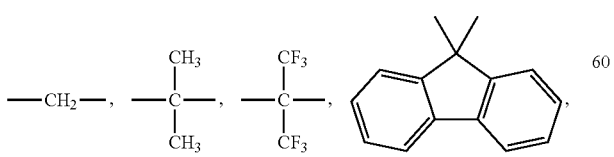

N represents 0 or 1; $R^5$ and $R^6$ each represent an alkyl group or an alkoxy group each having 1 to 4 carbon atoms and wherein $R^1$ to $R^4$ each represent a monovalent hydrocarbon group having 1 to 8 carbon atoms which may be the same or different from each other; "m" represents an integer of 1 to 100; B represents a positive number; A represents 0 or a positive number; and further Y represents a divalent organic group represented by the following formula (5),

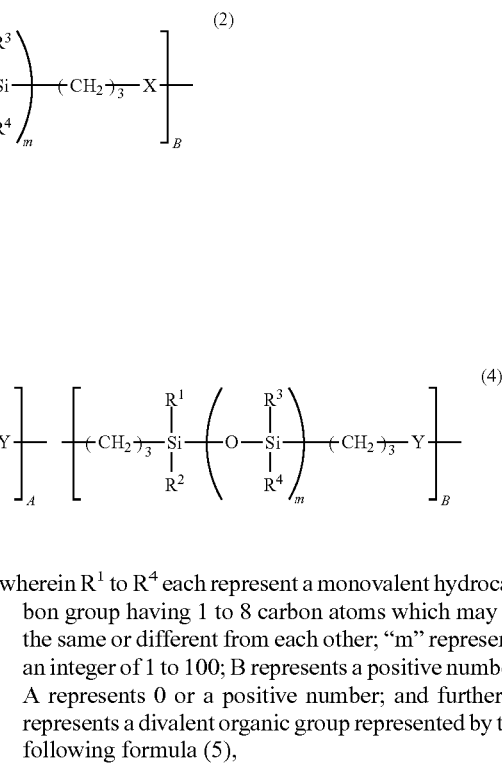

(5)

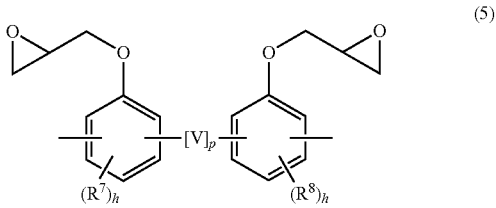

wherein V represents a divalent organic group selected from either of

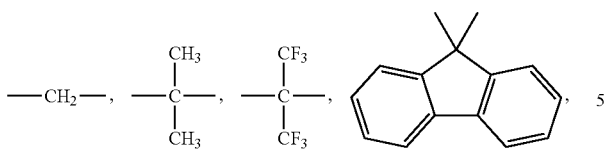
"p" represents 0 or 1, $R^7$ and $R^8$ each represent an alkyl group or an alkoxy group each having 1 to 4 carbon atoms, which may be the same or different from each other, and "h" represents either of 0, 1 or 2.
* * * * *